United States Patent [19]

Nakajima et al.

[11] Patent Number: 5,293,346

[45] Date of Patent: Mar. 8, 1994

[54] SIMPLIFIED SERIAL SELECTION CIRCUIT FOR SERIAL ACCESS IN SEMICONDUCTOR MEMORY AND OPERATING METHOD THEREOF

[75] Inventors: Michio Nakajima; Yukio Miyazaki, both of Hyogo, Japan

[73] Assignee: Mitsubishi Denki Kabushiki Kaisha, Tokyo, Japan

[21] Appl. No.: 760,470

[22] Filed: Sep. 17, 1991

[30] Foreign Application Priority Data

Sep. 28, 1990 [JP] Japan .................................. 2-260706

[51] Int. Cl.$^5$ .............................................. G11C 7/00
[52] U.S. Cl. ..................................... 365/221; 365/239
[58] Field of Search .................. 365/239, 221, 189.01

[56] References Cited

U.S. PATENT DOCUMENTS

| | | | |
|---|---|---|---|
| 4,120,048 | 10/1978 | Fuhrman | 365/239 |
| 4,779,234 | 10/1988 | Kaneko et al. | 365/221 |
| 4,805,139 | 2/1989 | Norris | 365/221 X |
| 4,858,190 | 8/1989 | Yamaguchi et al. | 365/221 X |
| 4,864,544 | 9/1989 | Spak et al. | 365/221 X |
| 4,951,253 | 8/1990 | Sahara et al. | 365/221 X |

OTHER PUBLICATIONS

IBM Technical Disclosure Bulletin, vol. 20, No. 2, Jul. 1977, pp. 732–733.

Primary Examiner—Eugene R. LaRoche
Assistant Examiner—Do Hyum Yoo
Attorney, Agent, or Firm—Lowe, Price, LeBlanc & Becker

[57] ABSTRACT

A serial selection circuit is disclosed for sequentially selecting a word line in a semiconductor memory. Flip-flops (latch circuits) for respectively holding the state are connected to each word line W0 to W1023. These flipflops are sequentially activated in response to two-phase non-overlap clock signals, and then deactivated. This serial selection circuit has the circuit structure being highly simplified compared with the conventional row decoder, so that the occupied area on the semiconductor chip is substantially reduced.

14 Claims, 7 Drawing Sheets

SIMPLIFIED SERIAL SELECTION CIRCUIT FOR SERIAL ACCESS IN SEMICONDUCTOR MEMORY AND OPERATING METHOD THEREOF

BACKGROUND OF THE INVENTION

1. Field of the Invention

The invention relates generally to serial selection circuits for semiconductor memories, and more particularly, to a serial selection circuit having simplified circuit structures. The invention has particular applicability to first-in first-out (FIFO) memories.

2. Description of the Background Art

In a semiconductor memory, there is often a need for accessing a memory cell for storing data in a predetermined sequence. That is, in a first-in first-out (hereinafter referred to as FIFO) memory having FIFO function, a last-in first-out (hereinafter referred to as LIFO) memory having LIFO function, a serial input-parallel output memory, a parallel input-serial output memory, a parallel input-parallel output memory and serial input-serial output memory and so on, it is necessary to designate a memory cell to be accessed in accordance with a predetermined sequence. The present invention is applicable to a serial selection circuit capable of selecting a memory cell row (or column) to be accessed in accordance with a predetermined sequence. A serial selection in a FIFO memory will be described in the following, as an example.

In a FIFO memory, stored data is read from a memory cell in the order that the data was written. That is, the stored data is read in a sequential order from the oldest one. In the case in which data is transmitted between devices or circuits having different processing speeds, a FIFO memory is often utilized in order to temporarily hold the data, and then adjust the timing.

FIG. 5 is a block diagram of a conventional FIFO memory. Referring to FIG. 5, this FIFO memory 2 includes 4096 static type memory cells MC disposed in a matrix including 1024 rows. Each 4 memory cells MC are respectively connected to a row decoder 17 over word lines W0 to W1023. 4 bit line pairs constituting 4 columns are connected to an I/O line pair 3 over a column selector 6.

This FIFO memory 2 includes a 2-bit counter 4 and a 10-bit counter 16 driven by an externally applied clock signal $\phi$. The input terminals of the decoder 5 for decoding a 2-bit signal are connected to the output $Q_A$ of the counter 4. The decoder 5 is responsive to the signal $Q_A$ for generating selection signals S0 to S3 for selecting one of 4 bit line pairs.

The counter 4 generates a carry signal RCO representing a cycle of the counter operation, i.e., a carry of the counter, and then applies it to the 10-bit counter 16. The counter 16 is responsive to the clock signal $\phi$ when the carry signal RCO is applied for effecting the counter operation. The counter 16 generates counter signals of 10 bits I0 to I9 for selecting 1024 word lines, and applies them to the row decoder 17. The row decoder 17 decodes the signals I0 to I9, and selects one of the word lines W0 to W1023.

Connected to the I/0 line pair 3 are a write control circuit 11 for controlling the writing of data, and an output control circuit 13 for controlling data output. The output control circuit 13 includes an output buffer, and is connected to a data output terminal Do. The write control circuit 12 is connected to receive an externally applied write control signal $\overline{WR}$ and connected to a data input terminal Di.

FIG. 6 is a timing chart for describing the operation of the FIFO memory 2 shown in FIG. 5. Referring to FIGS. 5 and 6, the operation will be explained. The 2-bit counter 4 effects the counter operation, and generates a counter signal $Q_A$ of 2 bits in response to an externally applied clock signal $\phi$. The decoder 5 generates signals S0 to S3 for selecting one of 4 bit line pairs in response to the signal $Q_A$. That is, when the signal $Q_A$ generated from the counter 4 is $(0)_H$, only the signal S0 attains a high level. Accordingly, a memory cell connected to the bit line pair on the column "0" is selected. Similarly, when the signal $Q_A$ is $(1)_H$, only the signal S1 attains a high level. The column "1" is then selected. When the signal $Q_A$ is $(2)_H$, only the signal S2 attains a high level. The column "2" is selected. When the signal $Q_A$ is $(3)_H$, only the signal S3 attains a high level. The column "3" is therefore selected.

When 2-bit counter 4 applies the signal $Q_A$ of $(3)_H$, it generates a carry signal RCO at a high level. When the signal RCO is at a high level, the 10-bit counter 16 effects the count operation in response to the clock signal $\phi$. The row decoder 17 drives high only one of the word lines W0 to W1023 in response to the output signals I0 to I9 of 10 bits applied from the counter. For example, the row decoder 17 drives only the word line W0 high in response to the output data I0 to I9 of $(0)_H$ generated from the counter 16. As a result, the memory cell on the column "0" among 4 memory cells connected to the word line W0 is designated.

In the period in which the word line W0 is at a high level, other columns "1", "2" and "3" are sequentially selected. That is, the decoder 5 sequentially supplies the signals S1 to S3 at a high level in response to the signal $Q_A$. Consequently, in the period in which the word line W0 is at a high level, that is, in the period in which the row "0" is selected, 4 memory cells on the row "0" are sequentially selected.

When the counter 4 supplies the carry signal RCO to the counter 16, the counter 16 applies to the row decoder 17 output data I0 to I9 for selecting the word line W1. The row decoder 17 drives only the word line W1 high. The column decoder 5 sequentially generates the output signals S0 to S3 at a high level in response to the signal $Q_A$ generated from the counter 4. Therefore, in the period in which the word line W1 is a high level, that is, in the period in which the row "1" is selected, 4 columns are sequentially selected.

It is becomes possible to access 4096 memory cells in a predetermined sequence by repeating the above-mentioned operation with respect to the all 1024 word lines W0 to W1023. The predetermined sequence is such that (row, column) to be accessed comes as follows: (0, 0), (0, 1), (0, 2), (0, 3), (1, 0), (1, 1), (1, 2), (1, 3), (2, 0), ... (1023, 2), (1023, 3). That is, in write operation, the data supplied to the data input terminal Din is written into the memory cell MC in this sequence. In read operation, the data written into the memory cell MC is read-out through the data output terminal Do in this sequence.

FIG. 7 is a circuit diagram illustrating an example of the row decoder 17 shown in FIG. 5. Referring to FIG. 7, this row decoder 17 includes a multiplicity of NAND gates connected to receive the data I0 to I9 generated from the 10-bit counter 16 and the inverted data thereof. In operation, for example, when the 10-bit counter 16 generates the data $(0)_H$, only the word line W0 is driven high. When the counter 16 is incremented, and the data $(1)_H$ is generated, then only the word line W1 is driven high. When the same operation is repeated and data $(3FF)_H$ is generated, then only the word line W1023 is driven high. As a result, this row decoder 17 may sequentially drive all the word lines W0 to W1023 high.

As described above, the conventional FIFO memory 2 requires a multiplicity of NAND gates to constitute the row decoder 17. That means that the circuit for constituting the row decoder 17 becomes complicated, and that the occupied area of the circuit on the semiconductor chip is increased. In addition, the 2-bit counter 4 and the 10-bit counter 16 are also required, so that the area occupied by the circuit for making up these counters is increased.

SUMMARY OF THE INVENTION

One object of the invention is to simplify a circuitry structure required to sequentially select a memory cell selecting line in a semiconductor memory.

Another object of the invention is to decrease an occupied area of circuitry on a semiconductor chip required to sequentially select a memory cell selecting line in a semiconductor memory.

Still another object of the invention is to simplify a circuitry structure of a sequential selection circuitry for sequentially selecting a plurality of signal lines.

Another object of the invention is to simplify a circuitry structure required to sequentially select a word line in a FIFO memory.

Yet another object of the invention is to decrease an occupied area of circuitry required to sequentially select a word line in a FIFO memory.

A serial selection circuitry for a semiconductor memory in accordance with the invention includes a plurality of selecting lines each connected to a memory cell for selecting a memory cell to be accessed, a plurality of state holding circuitry for holding the state of each selecting line, sequential activation circuitry responsive to a clock signal externally applied for sequentially activating the plurality of state holding circuitry, and deactivation circuitry responsive to the activation of the state holding circuitry in the subsequent stage for deactivating the state holding circuitry in the preceding stage.

In operation, this serial selection circuitry does not require a conventional counting circuitry nor a conventional decoder, so that the circuitry structure for sequentially selecting a plurality of selecting lines is simplified. The sequential selection circuitry in accordance with the invention, in some aspect, includes a plurality of state holding circuitry connected to a plurality of signal lines to be selected sequentially for holding the state of respective signal line, sequential activation circuitry responsive to a clock signal externally applied for sequentially activating the plurality of state holding circuitry, and deactivation circuitry responsive to the activation of the state holding circuitry in the subsequent stage for deactivating the state holding circuitry subsequent thereto.

In another aspect, the semiconductor memory in accordance with the present invention includes a plurality of selecting lines each connected to a plurality of memory cells for selecting a connected memory cell, a plurality of flipflops each connected to the plurality of selecting lines, setting circuitry responsive to an output signal generated from the adjoining flipflop in the preceding stage and a clock signal externally applied for sequentially setting a flipflop subsequent thereto, delay circuitry for delaying a clock signal externally applied, and resetting circuitry responsive to the delayed clock signal for resetting the flipflop set by the setting circuitry.

In still another aspect, the serial selection circuitry of the semiconductor memory in accordance with the invention includes a plurality of selecting lines for selecting a memory cell to be accessed, and a plurality of state holding circuitry for respectively holding the state of each selecting line. An operation method of the serial selection circuitry in accordance with the present invention includes the steps of sequentially activating the plurality of state holding circuitry in response to the clock signal externally applied, and deactivating the preceding state holding circuitry in response to the activation of the state holding circuitry in the subsequent stage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
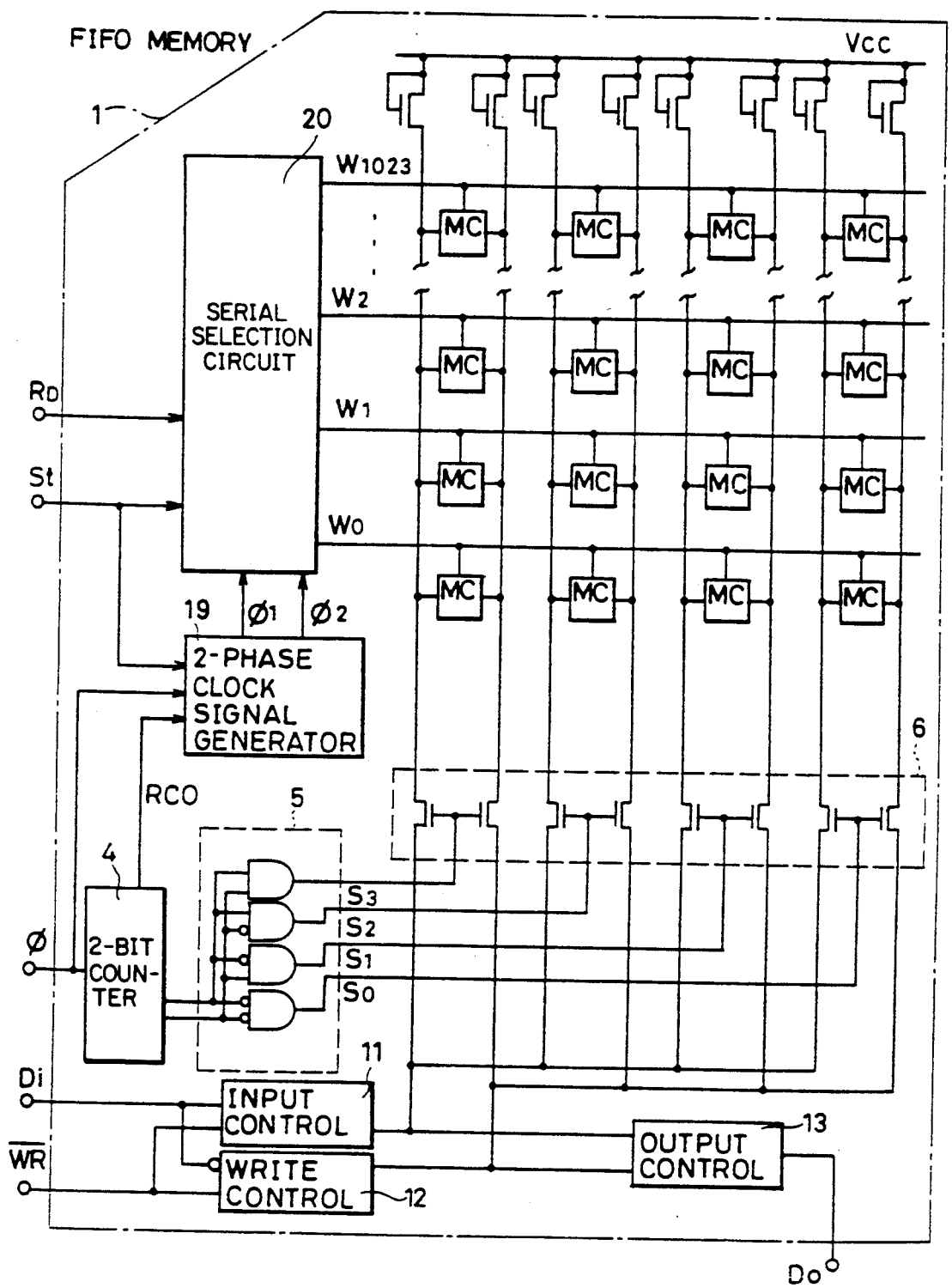
FIG. 2 is a circuit block diagram of a FIFO memory to which the serial selection circuit shown in FIG. 1 is applied.

Referring to FIG. 2, the FIFO memory 1 illustrating one embodiment of the present invention has the different points described in the following, as compared with the conventional FIFO memory 2 shown in FIG. 5. In place of the row decoder 17, a serial selection circuit 20 is provided. The serial selection circuit 20 sequentially drives high one of the 1024 word lines W0 to W1023. In addition to this, a two-phase clock signal generator 19 is provided for generating two-phase non-overlap clock signals $\phi 1$ and $\phi 2$ in response to an externally applied clock signal $\phi$. The non-overlap clock signals $\phi 1$ and $\phi 2$ generated by the two-phase clock signal generator 19 are applied to the serial selection circuit 20. Furthermore, an initialization signal $R_D$ and a start signal St for controlling the initial state of the serial selection circuit 20 are externally applied to the serial selection circuit 20 through an external terminal. As other circuit structures are the same as that of the conventional one shown in FIG. 7, the description thereof is omitted.

Figure 1:
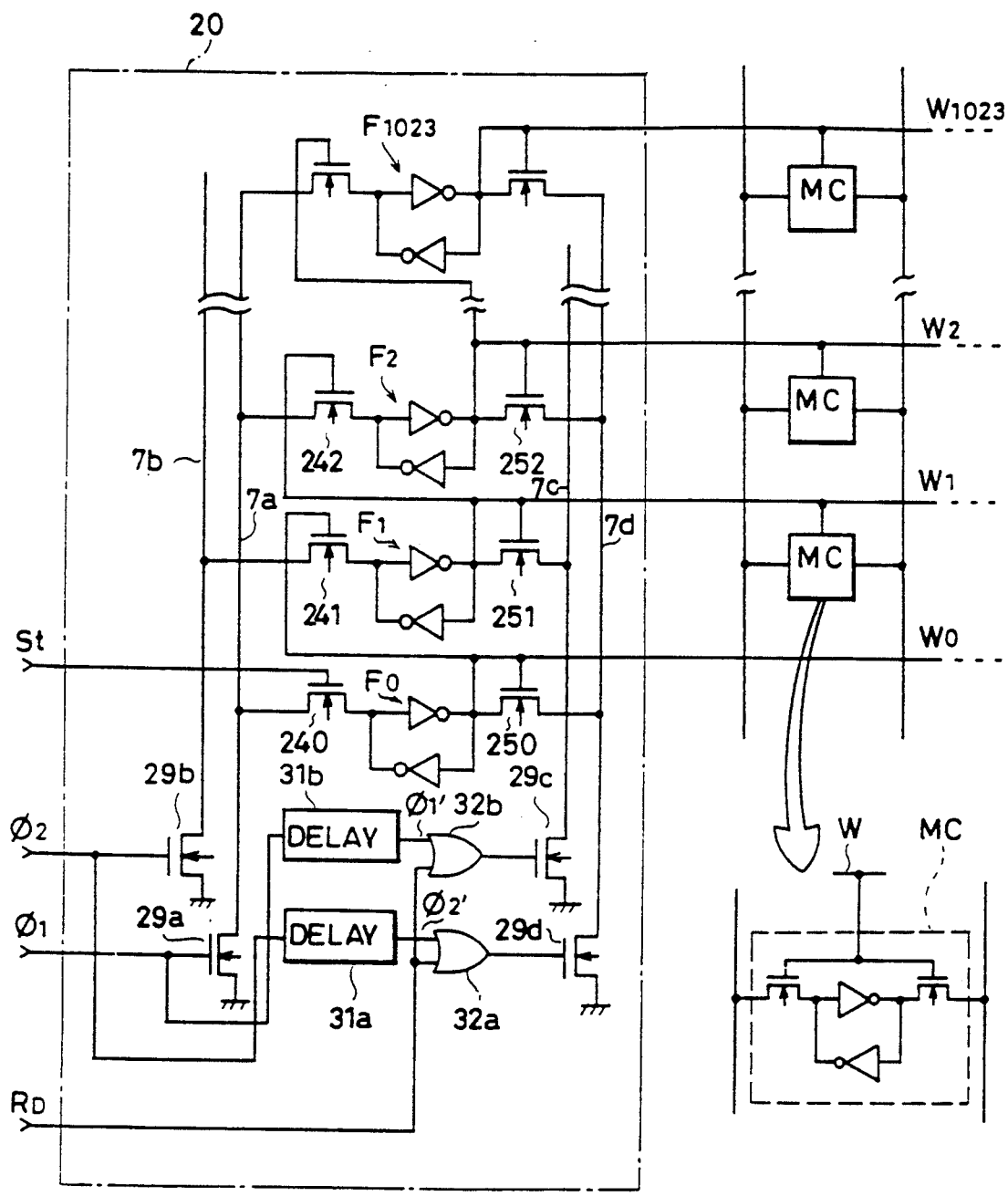
FIG. 1 is a circuit diagram of a serial selection circuit illustrating one embodiment of the present invention.

The details of the serial selection circuit 20 shown in FIG. 2 is illustrated in FIG. 1. Referring to FIG. 1, the serial selection circuit 20 includes 1024 flipflops (latch circuits) F0 to F1023 respectively connected to each word line W0 to W1023. Each flipflop F0 to F1023 comprises two cross-coupled inverters. The state of each word line W0 to W1023 is held by each flipflop F0 to F1023. Connected to first input and output of each flipflop F0 to F1023 are activation lines (set lines) 7a and 7b for activating (setting) each flipflop. Deactivation lines (reset lines) 7c and 7d for deactivating (resetting) each flipflop are connected to second input and output of each flipflop F0 to F1023. The activation line 7a is connected to the flipflops F0, F2 . . . in even-numbered order through access gate NMOS transistors 240, 242 . . . . The activation line 7b is connected to the flipflops F1 . . . F1023 in odd-numbered order through access gate NMOS transistors 241 . . . . The deactivation line 7c is connected to the flipflops F1 . . . F1023 in odd-numbered order through access gate NMOS transistors 251 . . . . The deactivation line 7d is connected to the flipflops F0, F2 . . . in even-numbered order through access gate NMOS transistors 250, 252 . . . .

The word line W0 is connected to the second input and output of the flipflop F0, and the gates of the transistors 241 and 250. The word line W1 is connected to the second input and output of the flipflop F1, and the gates of the transistors 242 and 251. In the same way, 1024 word lines W0 to W1023 are connected. The transistor 240 has the gate connected to receive an externally applied start signal St.

An NMOS transistor 29a for driving the activation line 7a is connected between the activation line 7a and the ground. Similarly, an NMOS transistor 29b for driving activation line 7b is connected between the activation line 7b and the ground. The transistors 29a and 29b have each gate connected to receive the two-phase non-overlap clock signals $\phi 1$ and $\phi 2$. The non-overlap clock signals $\phi 1$ and $\phi 2$ are respectively applied to OR gates 32b and 32a through delay elements 31b and 31a. The OR gates 32a and 32b have each second input connected to receive an externally applied initialization signal $R_D$. An NMOS transistor 29c is connected between a deactivation line 7c and the ground for driving the deactivation line 7c. An NMOS transistor 29d is connected between a deactivation line 7d and the ground for driving the deactivation line 7d. The transistor 29c has the gate connected to the output of the OR gate 32b. The transistor 29d has the gate connected to the output of the OR gate 32a. One example of the circuit structure of a static type memory cell MC is illustrated in FIG. 1.

Figure 3A:
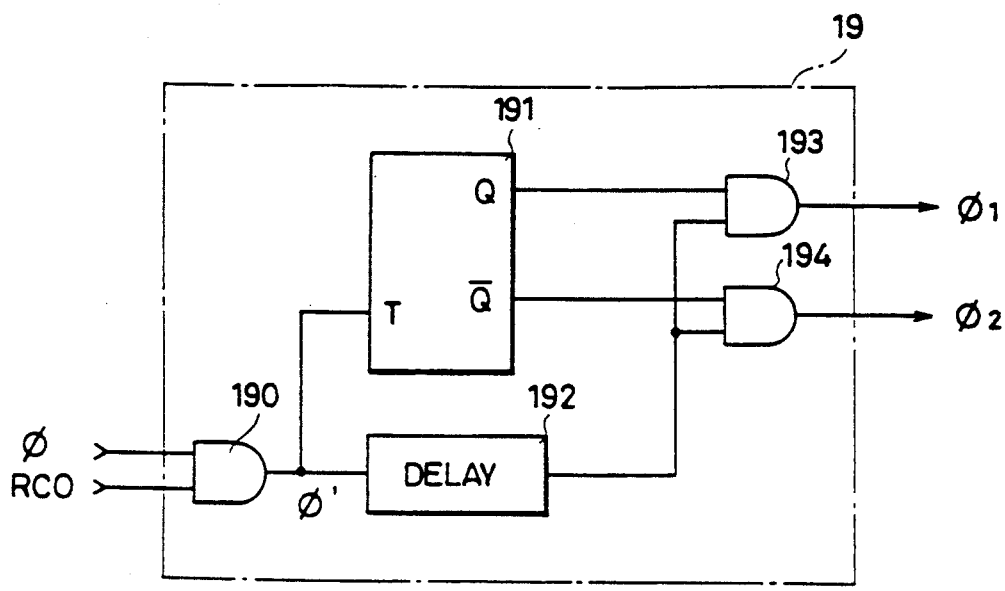
FIG. 3A is a circuit block diagram of a two-phase clock signal generator shown in FIG. 2.
Figure 3B:
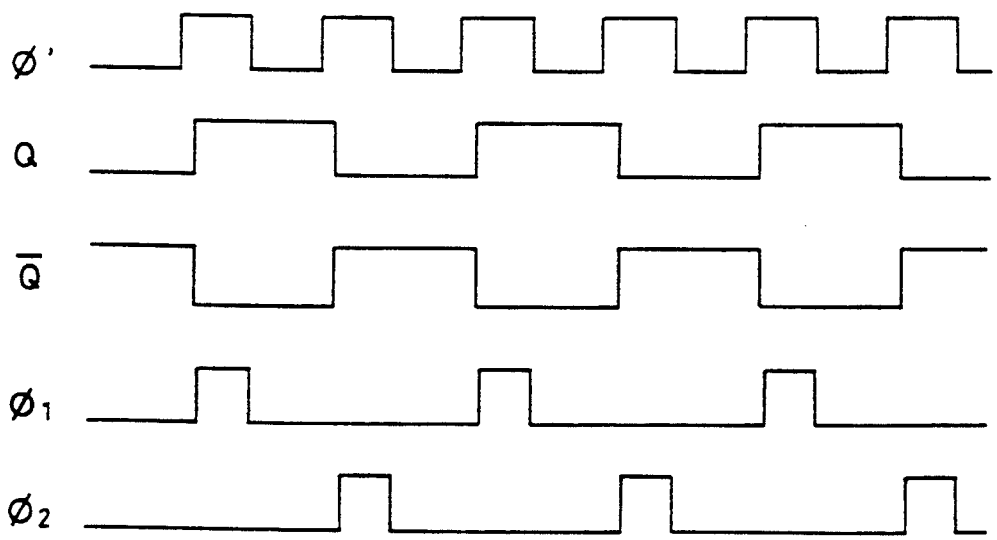
FIG. 3B is a timing diagram for explaining the operation of the two-phase clock signal generator shown in FIG. 3A.

FIG. 3A illustrates one example of the two-phase clock signal generator 19 shown in FIG. 2. Referring to FIG. 3A, this two-phase clock signal generator 19 includes an AND gate 190 for receiving signals $\phi$ and RCO, and generating a clock signal $\phi'$, a T flipflop 191 responsive to the clock signal $\phi'$ for toggling, a delay element 192 for delaying the clock signal $\phi'$, and two AND gates 193 and 194 connected to the output of the T flipflop 191. The AND gate 193 has the first input connected to the non-inverted output Q of the T flipflop 191, and the second input connected to receive the clock signal $\phi'$ delayed by the delay device 192. The AND gate 194 has the first input connected to the inverted output $\overline{Q}$ of the T flipflop 191, and the second input connected to receive the delayed clock signal $\phi'$. Two-phase non-overlap clock signals $\phi 1$ and $\phi 2$ are generated through the AND gates 193 and 194. The operation of the two-phase clock signal generator 19 shown in FIG. 3A will be understood referring to the timing diagram shown in FIG. 3B.

The operation of the FIFO memory 1 shown in FIGS. 1 and 2 will be described in the following with reference to FIG. 4. Firstly, an initialization signal $R_D$ at a high level is supplied, so that the transistors 29c and 29d turn on. Therefore, all the word lines W0 to W1023 are driven low. That is, if there is a word line having a potential at a high level among the word lines W0 to W1023, an access gate transistor (for example, the transistors 250, 251) turns on, so that the word line connected to the transistor is discharged through the access gate transistor and transistor 29c and/or 29d. Consequently, all the flipflops F0 to F1023 are reset. As a result, all the word lines W0 to W1023 are driven low.

A start signal St at a high level is externally applied, and a first pulse of the clock signal $\phi 1$ is supplied at the same time. Therefore, the transistors 240 and 29a are turned on, so that the flipflop F0 is inverted. As a result, only the word line W0 is caused to attain a high level.

A signal at a high level is supplied to the gate of the transistor 241 in response to the inversion of the flipflop F0. The first pulse of the clock signal $\phi 2$ is applied, so that the transistor 29b turns on. The flipflop F1 is inverted in response to the on-state of the transistors 241 and 29b. The word line W1 is therefore caused to attain a high level.

The first pulse of the clock signal $\phi 2$ is delayed by the delay element 31a, and the first pulse of the delayed clock signal $\phi 2'$ is applied to the gate of the transistor 29d through the OR gate 32a. The transistor 29d turns on, so that the word line W0 at a high level goes low. That is, the flipflop F0 is inverted, and caused to be in a reset state. The transistor 241 is turned off in response to the reset of the flipflop F0, so that the set state of the flipflop F1 is held.

In the same manner, the flipflop F2 is set, and the flipflop F1 is reset in response to the second pulse of the clock signal $\phi 1$. The flipflop F3 is set, and the flipflop F2 is reset in response to the second pulse of the clock signal $\phi 2$. The operation as described above is repeated, therefore sequentially causing all the word lines W0 to W1023 to attain a high level. The word lines W0 to W1023 may be sequentially selected in a predetermined sequence.

Figure 4:
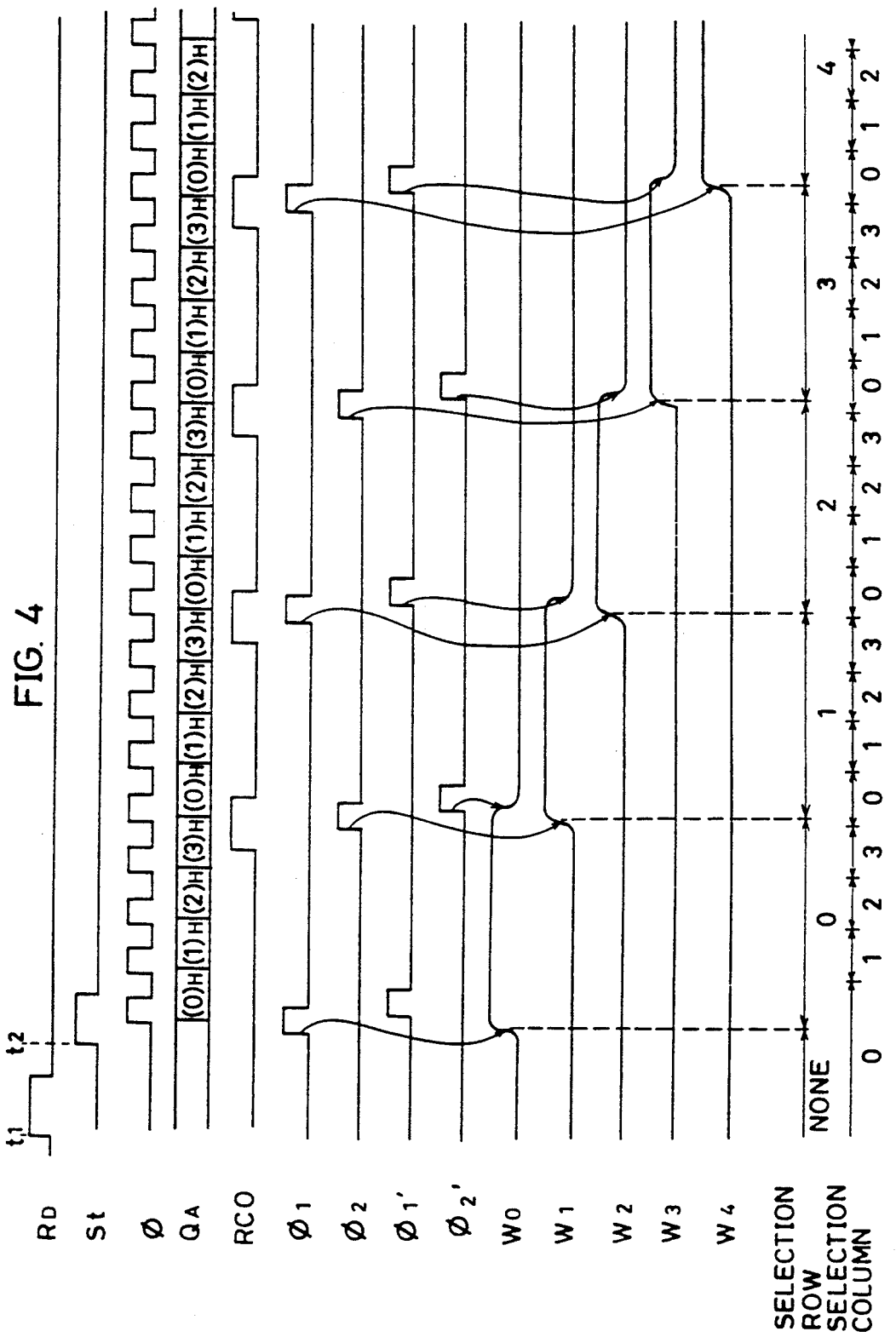
FIG. 4 is a timing diagram for explaining the operations of the circuits shown in FIG. 2.
Figure 5:
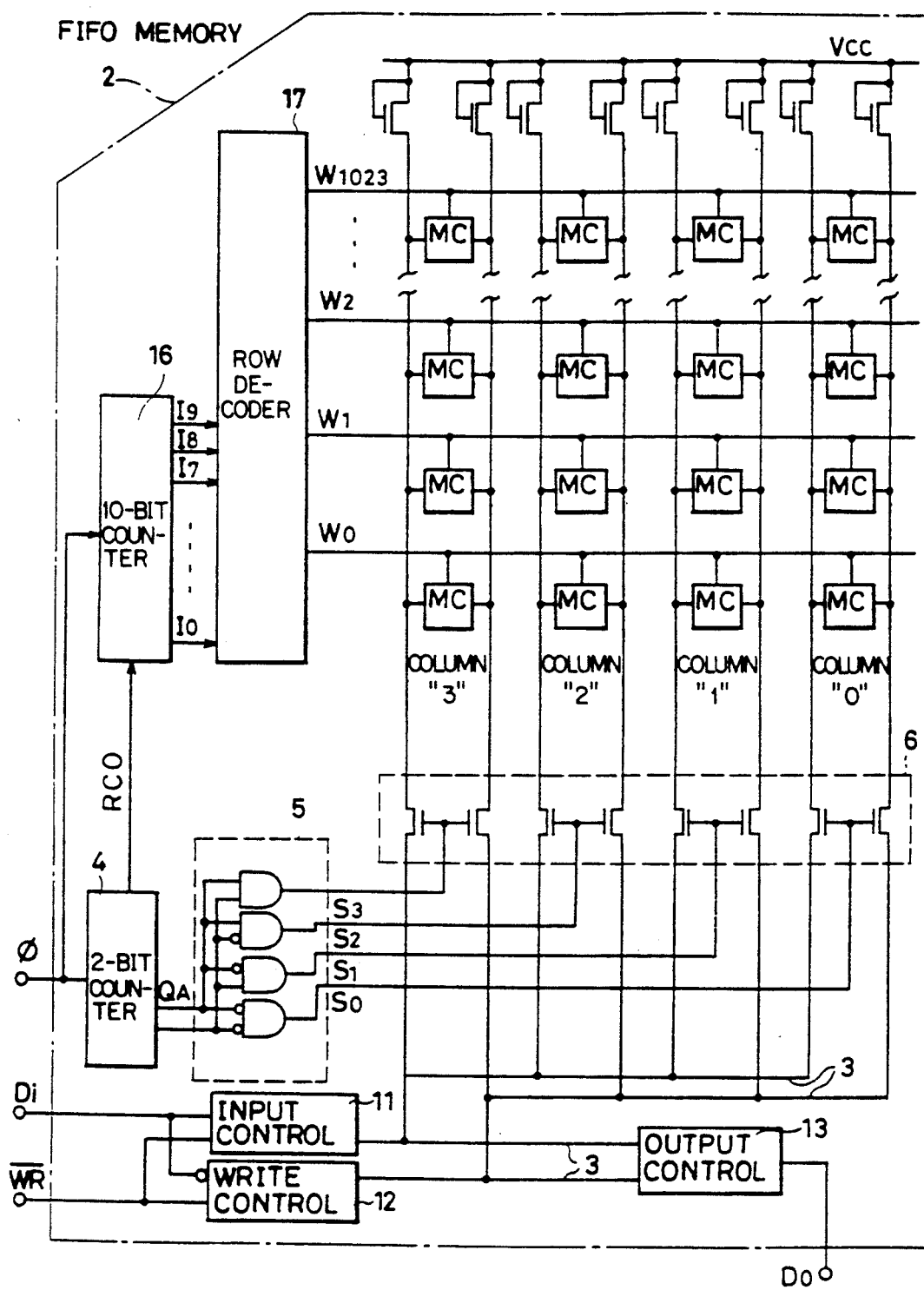
FIG. 5 is a circuit block diagram of a conventional FIFO memory.
Figure 6:
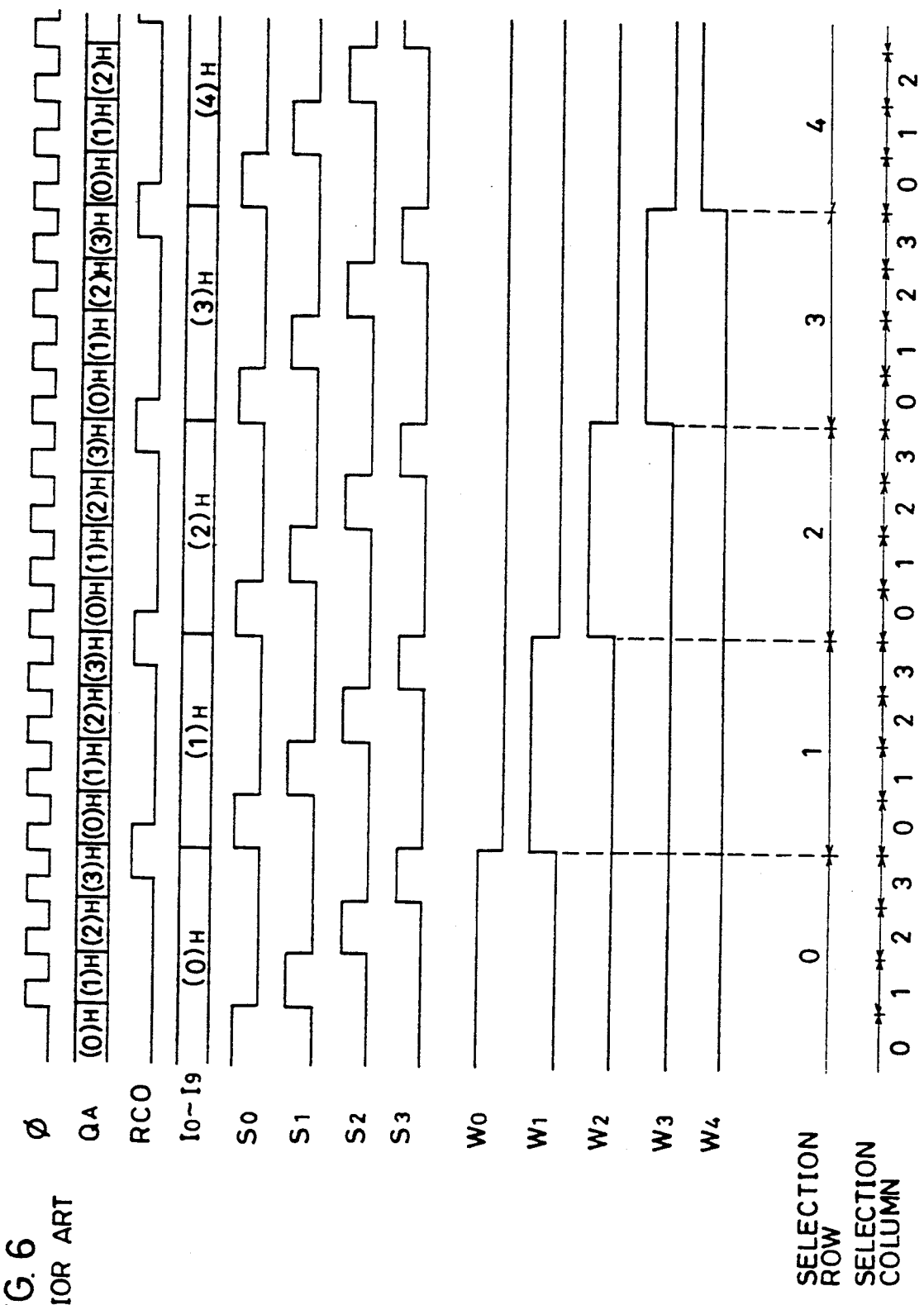
FIG. 6 is a timing diagram for explaining the operations of the circuits shown in FIG. 5.

In the period in which each word line W0 to W1023 is at a high level, in the same way as the conventional FIFO memory 2 shown in FIG. 5, 4 memory cells are sequentially selected which are designated by the column decoder 5. As shown in FIG. 4, while one row is selected, 4 columns are sequentially selected.

Figure 7:
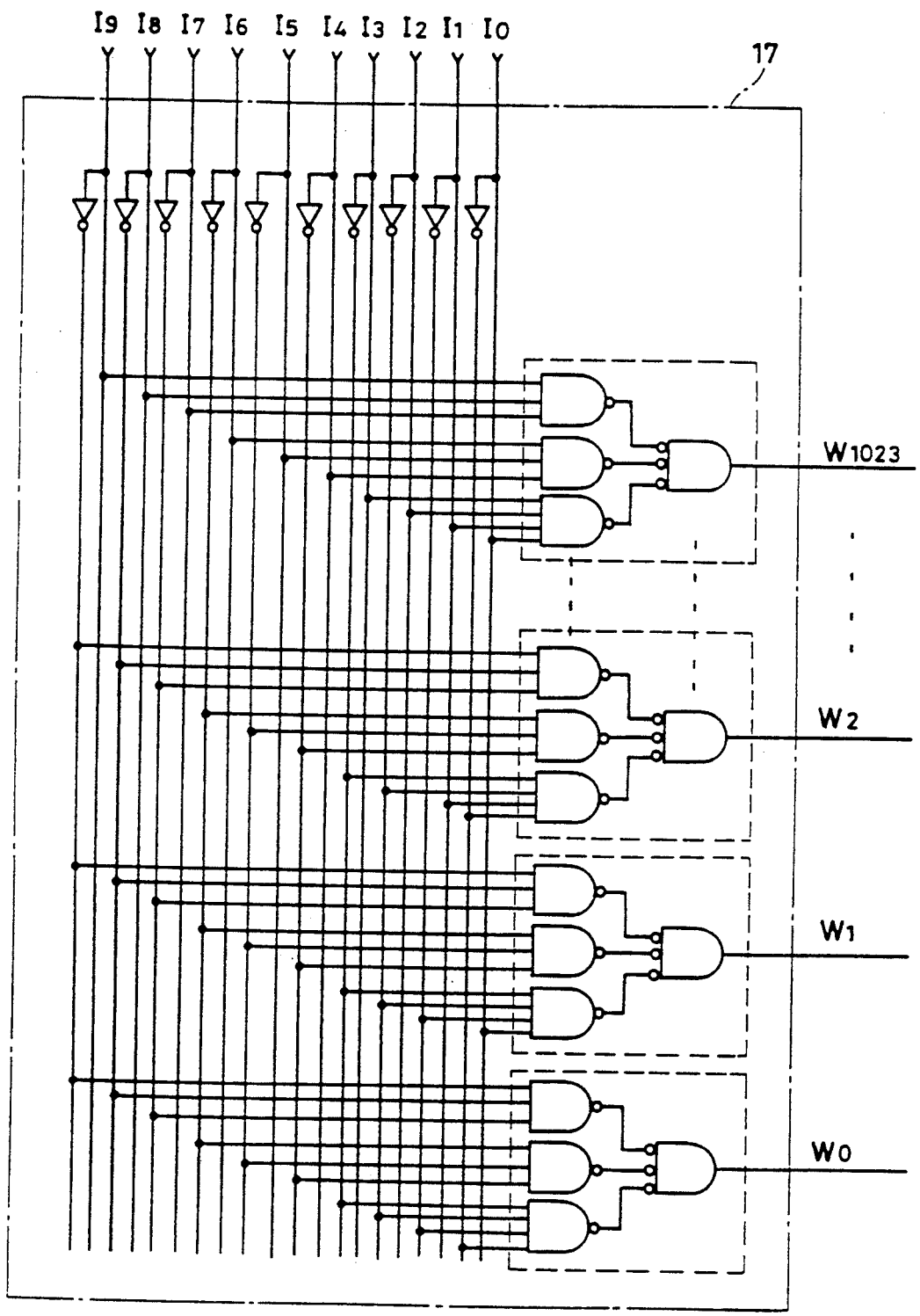
FIG. 7 is a circuit diagram of the row decoder shown in FIG. 5.

When a comparison is made between the circuit structure of the serial selection circuit shown in FIG. 1 and the circuit structure of the row decoder 17 shown in FIG. 7, it can be seen that the circuit structure necessary for selecting each word line W0 to W1023 is highly simplified in the serial selection circuit 20. In the row decoder 17 shown in FIG. 7, 4 NAND gates are required for selecting one word line. In the serial selection circuit 20 shown in FIG. 1, only required are two inverters and two access gate transistors constituting a flipflop for selecting one word line. A substantial simplification of a circuit structure for sequentially selecting a word line greatly reduces an occupied area of the circuit on the semiconductor chip. Additioanlly, the FIFO memory shown in FIG. 2 does not require a 10-bit counter 16, which is required in the conventional FIFO memory 2 shown in FIG. 5. While a two-phase clock signal generator 19 is required in place of the 10-bit counter, this circuit structure is extremely simple compared with the 10-bit counter. Accordingly, it is pointed out that the occupied area of the FIFO memory is reduced, seeing that the 10-bit counter is not required.

While the serial selection circuit 20 is applied only for selection of a word line in the FIFO memory 1 shown in FIG. 2, it is also possible to use a serial selection circuit having a similar circuit structure, in place of the column decoder 5 for column selection. In this case, the circuit structure for column selection is more simplified with respect to the case with the column decoder 5.

In the embodiment shown in FIG. 2, while the serial selection circuit 20 according to the present invention is applied to the FIFO memory 1, it is possible to apply the serial selection circuit to other memory requiring serial access. That is, the serial selection circuit in accordance with the present invention may be applicable not only in a parallel input—parallel output type memory such as an FIFO memory or an LIFO memory, but also in a serial input—parallel output type memory and a parallel input—serial output type memory.

The FIFO memory 1 shown in FIG. 2 have memory cells in 1024 rows and 4 columns. It is also possible to apply this serial selection circuit to a semiconductor memory having a larger storage capacity. As a storage capacity of a semiconductor memory increases, the number of selecting lines (for word lines) connected to memory cells to be accessed is increased, so that the effect of the simplification and the reduced occupied area of the circuit by the application of this serial selection circuit is enhanced.

It is also pointed out that the serial selection circuit according to the invention is applicable not only in a semiconductor memory having a single port as shown in FIG. 2, but also in a semiconductor memory having a dual port.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A serial selection circuit for a semiconductor memory comprising:
    a plurality of selecting lines each connected to a memory cell for selecting a memory cell to be accessed;
    a plurality of state holding means for respectively holding the state of each of said plurality of selecting lines;
    activation means responsive to an externally applied clock signal for sequentially activating said plurality of state holding means; and
    deactivation means responsive to the activation of the state holding means in the subsequent stage for deactivating the state holding means in the preceding stage.

2. The serial selection circuit for a semiconductor memory according to claim 1, wherein said sequential activation means comprises:
    means responsive to said externally applied clock signal for generating an activation potential for activating said plurality of state holding means; and
    activation potential applying means responsive to the activation of the state holding means in the preceding stage for applying the activation potential to the state holding means in the subsequent stage.

3. The serial selection circuit for a semiconductor memory according to claim 1, wherein said deactivation means comprises:
    delay means for delaying said externally applied clock signal;
    means responsive to the clock signal delayed by said delay means for generating a deactivation potential for deactivating said plurality of state holding means; and
    deactivation potential applying means responsive to the activation of the state holding means in the subsequent stage for applying the deactivation potential to the state holding means in the preceding stage.

4. The serial selection circuit for a semiconductor memory according to claim 1, wherein each of said state holding means is connected to each of said selecting lines, and comprises flipflop means for holding the potential of the selecting line.

5. The serial selection circuit for a semiconductor memory according to claim 4, wherein said flipflop means comprises 2 cross-coupled inverter means connected to each of said selecting lines.

6. The serial selection circuit for a semiconductor memory according to claim 1, wherein said plurality of selecting lines comprise a plurality of word lines each connected to a memory cell.

7. A serial selection circuit for a semiconductor memory comprising:
    a plurality of selecting lines each connected to a memory cell for selecting a memory cell to be accessed;
    a plurality of state holding means for respectively holding the state of each of said plurality of selecting lines;
    activation means responsive to an externally applied clock signal for sequentially activating said plurality of state holding means; and
    deactivation means responsive to the activation of the state holding means in the subsequent stage for deactivating the state holding means in the preceding stage;
    wherein said sequential activation means comprises:
    means responsive to said externally applied clock signal for generating a first activation signal for activating an odd-numbered one of said plurality of state holding means;
    means responsive to said externally applied clock signal for generating a second activation signal for activating an even-numbered one of said plurality of state holding means,
    said first and second activation signals being generated at timings different from each other;
    means responsive to the activation of the state holding means in the preceding state, and in even-numbered order for applying the first activation signal to the state holding means in the following odd-numbered order,
    said state holding means in the following odd-numbered order being activated in response to the applied first activation signal; and
    means responsive to the activation of the state holding means in the preceding state and in odd-numbered order for applying the second activation signal to the state holding means in the following even-numbered order, said state holding means in the following even-numbered order being activated in response to the applied second activation signal.

8. A serial selection circuit for a semiconductor memory comprising:
- a plurality of selecting lines each connected to a memory cell for selecting a memory cell to be accessed;
- a plurality of state holding means for respectively holding the state of each of said plurality of selecting lines;
- activation means responsive to an externally applied clock signal for sequentially activating said plurality of state holding means; and
- deactivation means responsive to the activation of the state holding means in the subsequent stage for deactivating the state holding means in the preceding stage;
- wherein said deactivation means comprises:
- means responsive to said externally applied clock signal for generating a first deactivation signal for deactivating the one in odd-numbered order of said plurality of state holding means;
- means responsive to said externally applied clock signal for generating a second deactivation signal for deactivating the one in even-numbered order of said plurality of state holding means,
- said first and second deactivation signals being generated at timings different from each other;
- means responsive to the activation of the state holding means in the subsequent stage and in even-numbered order for applying the first deactivation signal to the state holding means in the preceding odd-numbered order,
- said state holding means in the preceding odd-numbered order being deactivated in response to the applied first deactivation signal; and
- means responsive to the activation of the state holding means in the subsequent stage and in odd-numbered order for applying the second deactivation signal to the state holding means in the preceding even-numbered order,
- said state holding means in the preceding even-numbered order being deactivated in response to the applied second deactivation signal.

9. A serial selection circuit for a semiconductor memory device comprising:
- first and second selecting lines each connected to a memory cell for selecting a memory cell to be accessed;
- first and second state holding means for respectively holding the state of each of said first and second selecting lines;
- sequential activation means responsive to an externally applied clock signal for sequentially activating said first and second state holding means; and
- deactivation means responsive to the activation of the second state holding means for deactivating the first state holding means.

10. A sequential selection circuit for sequentially selecting a plurality of signal lines comprising:
- a plurality of state holding means each connected to each of said plurality of signal lines for holding the state of respective signal line;
- sequential activation means responsive to an externally applied clock signal for sequentially activating said plurality of state holding means; and
- deactivation means responsive to the activation of the state holding means in the subsequent stage for deactivating the state holding means subsequent thereto.

11. An operating method for a serial selection circuit in a semiconductor memory device, said serial selection circuit comprising:
- a plurality of selecting lines each connected to a memory cell for selecting a memory cell to be accessed; and
- a plurality of state holding means for respectively holding the state of each of said plurality of selecting lines, said method comprising the steps of:
- sequentially activating said plurality of state holding means in response to an externally applied clock signal; and
- deactivating the preceding state holding means in response to the activation of the state holding means in the subsequent stage.

12. The operating method for a serial selection circuit in a semiconductor memory device according to claim 11, wherein said step of sequentially activating said plurality of state holding means comprises the steps of:
- generating an activation potential for activating said plurality of state holding means in response to said externally applied clock signal; and
- applying the activation potential to the state holding means in the subsequent stage in response to the activation of the state holding means in the preceding stage.

13. The operating method for a serial selection circuit in a semiconductor memory device according to claim 11, wherein said step of deactivating said state holding means in the preceding stage comprises the steps of:
- delaying said externally applied clock signal;
- generating a deactivation potential for deactivating said plurality of state holding means in response to the delayed clock signal; and
- applying the deactivation potential to the state holding means in the preceding stage in response to the activation of the state holding means in the subsequent stage.

14. A semiconductor memory device capable of sequentially selecting a plurality of memory cells comprising:
- a plurality of selecting lines each connected to said plurality of memory cells for selecting a connected memory cell;
- a plurality of flipflop means each connected to said plurality of selecting lines;
- means for receiving an externally applied clock signal;
- set means each connected to said plurality of flipflop means, and responsive to an output signal generated from an adjoining flipflop means in the preceding stage and the externally applied clock signal for sequentially setting the flipflop means subsequent thereto;
- delay means for delaying said externally applied clock signal; and
- reset means each connected to said plurality of flipflop means, and responsive to the delayed clock signal for resetting the flipflop means set by said set means.

* * * * *